(12) United States Patent
Biber

(10) Patent No.: US 10,473,740 B2
(45) Date of Patent: Nov. 12, 2019

(54) REDUNDANT COOLING SYSTEM FOR A MAGNETIC RESONANCE TOMOGRAPHY SYSTEM

(71) Applicant: Stephan Biber, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 123 days.

(21) Appl. No.: 15/712,725

(22) Filed: Sep. 22, 2017

(65) Prior Publication Data

US 2018/0081012 A1   Mar. 22, 2018

(30) Foreign Application Priority Data

Sep. 22, 2016   (DE) .................. 10 2016 218 200

(51) Int. Cl.
| | |
|---|---|
| *F25B 19/00* | (2006.01) |
| *G01R 33/38* | (2006.01) |
| *H01F 6/04* | (2006.01) |
| *G01R 33/385* | (2006.01) |
| *G01R 33/3815* | (2006.01) |

(52) U.S. Cl.
CPC .......... *G01R 33/3804* (2013.01); *H01F 6/04* (2013.01); *F25B 2600/25* (2013.01); *G01R 33/385* (2013.01); *G01R 33/3815* (2013.01)

(58) Field of Classification Search
CPC .......... F25B 2600/25; H01M 8/04067; H05K 7/20836; H05K 7/20754; F25D 7/00; G01R 33/3856; G01R 33/3804; G01R 33/3815; G01R 33/385; H01F 6/04

USPC ........................................................ 62/51.1
See application file for complete search history.

(56) References Cited

U.S. PATENT DOCUMENTS

| | | | |
|---|---|---|---|
| 8,631,665 B1* | 1/2014 | DeClementi | F25D 7/00 415/213.1 |
| 8,749,968 B1* | 6/2014 | Branton | H05K 7/20754 361/679.53 |
| 2013/0128918 A1* | 5/2013 | Campbell | H05K 7/20836 374/57 |
| 2015/0017559 A1* | 1/2015 | Klewer | H01M 8/04067 429/435 |
| 2016/0091580 A1 | 3/2016 | Kreischer | |

FOREIGN PATENT DOCUMENTS

DE   102014219741 A1   3/2016

OTHER PUBLICATIONS

German Office Action for German Application No. 10 2016 218 200.5 dated May 30, 2016.

* cited by examiner

*Primary Examiner* — David D Hwu
(74) *Attorney, Agent, or Firm* — Lempia Summerfield Katz LLC

(57) ABSTRACT

A cooling system for a magnetic resonance tomography system is provided. The cooling system includes a first coolant circuit with a first coolant pump and a first heat exchanger in thermal contact with an object to be cooled. The first cooling circuit further includes a switchover apparatus that is configured to adjust a heat flow from the first coolant circuit optionally to a first heat sink and/or a second heat sink. In such cases the second heat sink is a second heat exchanger that is fluidically connected to an emergency cooling system.

17 Claims, 3 Drawing Sheets

REDUNDANT COOLING SYSTEM FOR A MAGNETIC RESONANCE TOMOGRAPHY SYSTEM

This application claims the benefit of DE 10 2016 218 200.5, filed on Sep. 22, 2016, which is hereby incorporated by reference in its entirety.

BACKGROUND

The present embodiments relate to a cooling system for a magnetic resonance tomography system.

Magnetic resonance tomography systems are imaging apparatuses that, in order to map an examination object, align the nuclear spins of the examination object with a strong outer magnetic field and by a magnetic alternating field, excite the nuclear spins for precession about this alignment. The precession or return of the spins from this excited state into a state with less energy generates, as a response, a magnetic alternating field (e.g., magnetic resonance signal) that is received via antennae.

With the aid of magnetic gradient fields, a spatial encoding is impressed onto the signals, which then permits an assignment of the received signal to a volume element. The received signal is then evaluated, and a three-dimensional imaging representation of the examination object is provided. The generated representation specifies a spatial density distribution of the spins.

Superconducting magnets, which are to be cooled below a transition temperature that lies at a few Kelvin degrees, are typically used to generate the strong outer magnetic field with field strengths of greater than 0.5 or 1 Tesla. Despite state-of-the-art insulating components, a permanent cooling of or heat discharge from the superconducting magnets is provided in order to retain the requisite low temperature. In such cases, pulse tube coolers that reach a temperature gradient from room temperature to the temperature of the liquid helium in one stage, are used inter alia as cooling elements. Due to the large temperature difference, the thermodynamic degree of efficiency is, however, so minimal that significant quantities of heat are to be discharged from the hot side of the pulse tube cooler. Compressors for operating the pulse tube cooler are also considered as the hot side of the pulse tube cooler.

In such cases, typical cooling systems have two cooling circuits. The components to be cooled are thermally coupled to a first cooling circuit. The heat is then discharged from the first cooling circuit to a second cooling circuit that outputs this to the environment. Due to excessively high ambient temperatures, the first cooling circuit and the second cooling circuit are frequently coupled via a heat pump, so that the temperature of the coolant in the first cooling circuit is clearly below the ambient temperature, and the degree of efficiency of the pulse tube cooler is increased and use is first enabled.

With a magnetic resonance tomography system, the cooling system may also be used to cool electrical components.

If a cooling system of this type fails for long periods of time, the superconducting magnet heats up. The further cooling-down of the magnet and the subsequent ramp-up require significant time and a correspondingly expensive operating failure even if prior to exceeding the transition temperature, the magnet may be discharged by a ramp-down so that no consequential damage occurs.

Conversely, however, the cooling system requires significant electrical power, so that the emergency power supply is to be sufficiently large and thus requires correspondingly expensive emergency current systems in order to maintain the cooling with the conventional cooling system. Due to large quantities of helium in the magnets and the large thermal capacity associated therewith, a corresponding emergency cooling system is, therefore, often forgone.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a cooling system for a magnetic resonance tomography system that enables a cost-efficient emergency cooling is provided.

One embodiment of a cooling system for a magnetic resonance tomography system includes a first coolant circuit. Fluids with a higher thermal capacity and a low risk potential (e.g., water with additives such as glycol) may be used as a coolant. In such cases, the first coolant circuit may be a closed circuit. The coolant circulates in the coolant circuit by a coolant pump. The first coolant circuit also includes a first heat exchanger that is in thermal contact with an object to be cooled. With the described pulse tube cooler, the hot end of the pulse tube cooler as an object to be cooled may thus be cooled by the cooling fluid circulating in the first cooling circuit.

The cooling system of one or more of the present embodiments includes a switchover apparatus that is configured to adjust a heat flow from the first coolant circuit optionally to a first heat sink and/or a second heat sink. Each apparatus that guides the heat flow to a significant extent in another direction may be a switchover apparatus. More than 10, 20 or 50% of the heat output takes a different path, but one of the heat sinks does not have to be completely uncoupled.

For example, provision can be made for valves that deflect the cooling fluid within the first cooling circuit. Active elements such as a pump that drives the cooling circuit in another direction may, however, also be provided. In one embodiment, the switchover apparatus may change a temperature gradient in the cooling system, so that the heat flow takes a different path in accordance with this temperature gradient. Therefore, the first cooling circuit may be cooled at an additional point, for example, and/or the first heat sink may no longer be cooled. It may also be possible to produce a thermal contact via a mechanical element with a heat conductor, or also to open the same again.

The cooling system of one or more of the present embodiments includes a second heat exchanger as a second heat sink. The second heat exchanger is fluidically connected to an emergency cooling system. The emergency cooling system may be an inflow for an emergency coolant, for example. In such cases, the first cooling circuit and the emergency coolant are in thermal contact; no fluid exchange takes place, however. In one embodiment, however, the emergency cooling system may be a fan that blows ambient air through the second heat exchanger and thus outputs heat to the environment.

The cooling system of one or more of the present embodiments is able to guide the heat flow to a second heat sink in thermal contact with an emergency cooling system, so that in case of a power failure, an energy-intensive cooling process of the first heat sink may be decommissioned, for example, by an emergency cooling system with water from the drinking water supply, and a provisional cooling system may be maintained for longer and/or provided more cost-effectively.

With the magnetic resonance tomography system of one or more of the present embodiments, the cooling system is configured to cool a thermal head of a cryogenic cooler (e.g., of a pulse tube cooler) also including an associated compressor.

The magnetic resonance tomography system of one or more of the present embodiments, by the cooling system, enables a longer bridging of a power failure with a more cost-effective but less powerful emergency power supply.

In one embodiment of the cooling system, the switchover apparatus includes an actuator for changing a flow rate of an emergency coolant from the emergency cooling system through the second heat exchanger. For example, an adjustable valve or a pump that routes the emergency coolant through the second heat exchanger may be provided.

By the emergency coolant being routed through the second heat exchanger, a temperature gradient advantageously develops, which results in a larger part of the heat output discharging through the second heat sink (e.g., if the first heat sink heats up in this context due to the power failure or due to the heat pump being shut down in order to save energy).

In one embodiment of the cooling system, the second heat exchanger is part of the first coolant circuit. In other words, the cooling fluid of the first cooling circuit circulates through the second heat exchanger.

The consumption of electrical energy is reduced (e.g., for a heat pump between the first cooling circuit and a second cooling circuit) by directly cooling the cooling fluid of the first cooling circuit in the second heat exchanger by the emergency coolant. This embodiment may be used if the emergency coolant already has a low temperature (e.g., below the room or ambient temperature).

In one embodiment of the cooling system, the first cooling circuit has a first multi-way valve. The first multi-way valve is fluidically connected to the second heat exchanger and the first cooling circuit such that the second heat exchanger may be included in the first coolant circuit by actuating the multi-way valve. In such cases, the multi-way valve may, for example, simultaneously separate other elements from the first coolant circuit, or a second multi-way valve that alone or in collaboration with the first multi-way valve separates the element or other elements from the first coolant circuit is provided.

The first multi-way valve enables the second heat exchanger in the first cooling circuit to be switched on and thus to achieve a heat exchange with the emergency coolant. In such cases, an additional flow resistance of the second heat exchanger may be avoided in a normal cooling mode.

In one embodiment of the cooling system, the cooling system has a second cooling circuit that is thermally coupled to the first cooling circuit and has the first heat sink. For example, the second cooling circuit may be a closed cooling circuit that, as a heat sink, includes a cooler, through which air flows, that outputs the heat to the ambient air.

The second heat exchanger is part of the second coolant circuit (e.g., the cooling fluid of the second cooling circuit flows through the second heat exchanger).

The second heat exchanger in the second cooling circuit offers the possibility of performing a further temperature drop by a heat pump between the first cooling circuit and the second cooling circuit if, for example, a flow temperature of the emergency coolant is not sufficiently low.

In one embodiment of the cooling system, the second cooling circuit has a third multi-way valve, and the second heat exchanger may be included in the second coolant circuit by the third multi-way valve. In such cases, i the third multi-way valve in such cases may separate other elements from the first cooling circuit simultaneously or in collaboration with a further multi-way valve.

The third multi-way valve enables the second heat exchanger to be switched on in the second coolant circuit and thus to achieve a heat exchange with the emergency coolant. In such cases, an additional flow resistance of the second heat exchanger may be avoided in a normal cooling mode.

In one embodiment of the cooling system, the cooling system has an uninterruptible power supply. The uninterruptible power supply may be a battery-powered emergency power system or an emergency power generator, for example. The uninterruptible power supply is configured only to energize elements of the cooling system that are necessary to maintain the heat flow from the first coolant circuit to the second heat sink. Aside from the power supply for operation of the pulse tube cooler, this may be a pump, for example, in order to maintain a coolant circuit from the pump to an air heat exchanger and a fan, in order to output heat from the heat exchanger to the ambient air. In other embodiments, this may also still include a heat pump, solenoid valves, or further pumps. The term only is accordingly to be understood to be that, for example, no further electrical devices of the cooling system, which are not required to maintain the emergency cooling operation by the second heat sink and have a significant current consumption that significantly shortens a possible duration of the emergency operation, are operated by the uninterruptible power supply. Operation of parts of the cooling system with a low power consumption such as, for example, displays or lighting is, however, conceivable.

By the uninterruptible power supply of only energizing elements that are required to maintain the emergency cooling by the second heat sink, the uninterruptible power supply may maintain the emergency cooling for longer and/or may thus be configured to be smaller and thus more cost-effective.

In one embodiment of the cooling system, the second heat exchanger is a 3-way heat exchanger that also exchanges heat with the first heat sink. In the context of the present embodiments, a 3-way heat exchanger may be a heat exchanger that may cause the first coolant circuit to exchange heat with two different heat sinks (e.g., with the first and/or second heat sink). This may be a heat exchanger, for example, with a fluid of the first cooling circuit exchanging heat, consecutively, by the fluid firstly exchanging heat with the first heat sink and with the second heat sink, or, alternatively, by the fluid exchanging heat with the first or with the second heat sink (e.g., by a valve of the 3-way heat exchanger).

The 3-way heat exchanger enables a particularly compact design of the cooling system.

DETAILED DESCRIPTION

Figure 1:
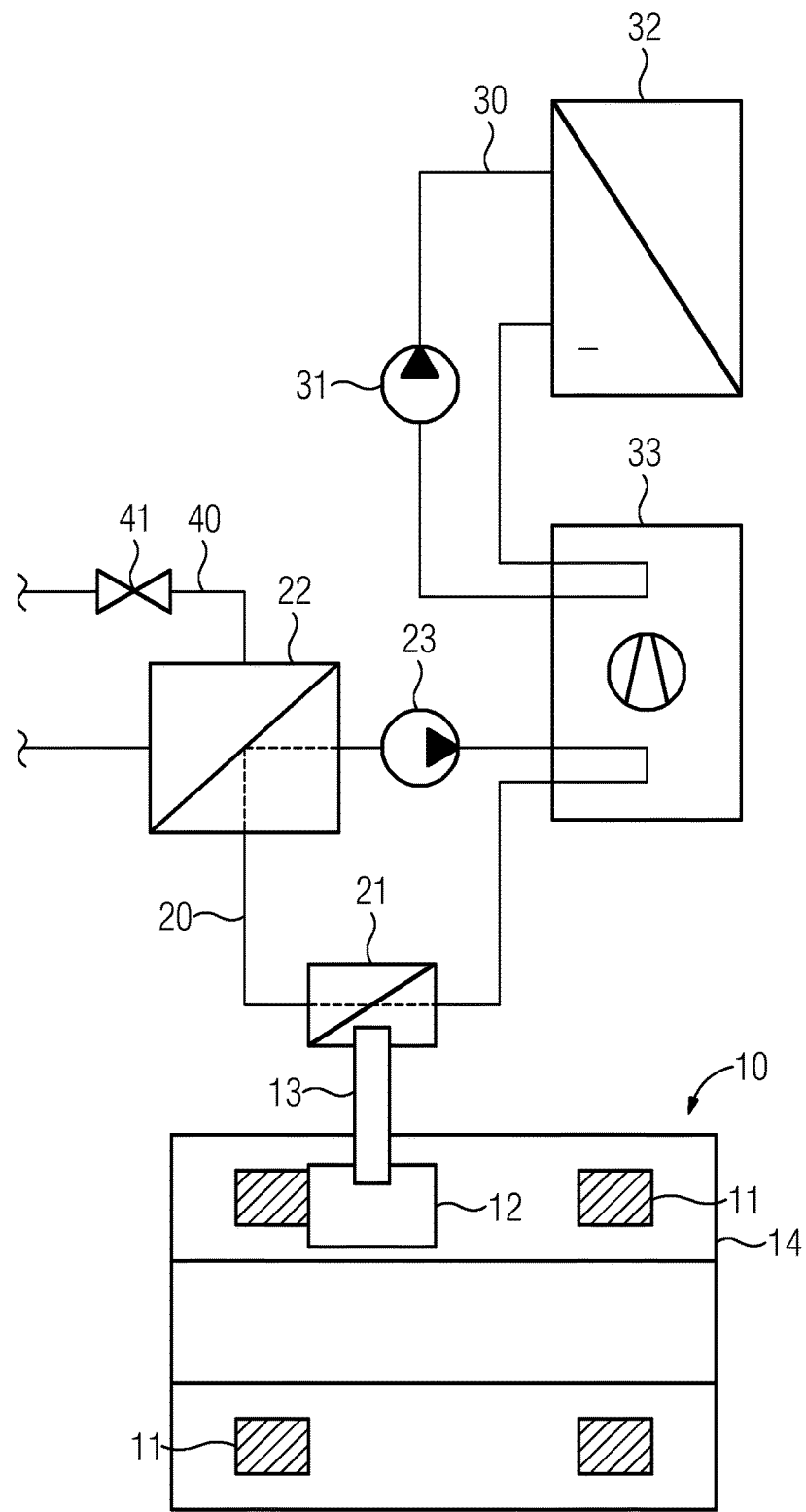
FIG. 1 shows an embodiment of a cooling system.

FIG. 1 shows a magnet system 10 of a magnetic resonance tomography system with an embodiment of a cooling system.

A field magnet 11 is arranged for cooling in a cryostat 14. The field magnet 11 is cooled down by a cooling system or a cryogenic cooling system in so far as a superconducting state exists in the field magnet 11. In such cases, a pulse tube cooler 13 may be provided as a cooling system, for example, that in one stage produces the requisite temperature difference between the cold head (e.g., end cooled by the pulse tube cooler) and hot head. Hot head may refer to an area in which the heat is to be output. This may also include a compressor used to operate the cooling system.

In the example shown, the cold head is in thermal contact with a cold reservoir 12 and the field magnet 11. A helium bath made from liquid helium frequently forms the cold reservoir 12, which is cooled by the pulse tubes 13 and surrounds the superconducting magnet. For example, the high thermal capacity of helium at the low temperatures may in such cases bridge a failure of the cooling system for long periods of time.

With rising helium prices and the need to offer a possibility of pressure equalization for the helium with a sudden temperature rise (e.g., a quench of the superconducting magnet), systems that only have a small cold reservoir 12 of liquid helium and transmit the heat from the field magnet 11 through heat conduction via mechanical contact without fluid as an intermediary are being used increasingly.

Irrespective of whether a small or a large cold reservoir 12 exists, the cooling system 21 of one or more of the present embodiments has a first heat exchanger 21 that is in thermal contact with the hot head of the pulse tube cooler 13, and is configured to cool the hot head to below a provided operating temperature. The first heat exchanger 21 is thus included in a fluid circuit of the first cooling circuit 20. The first cooling circuit 20 also has a first heat sink in the form of the heat pump 33 and a second heat sink in the form of the second heat exchanger 22. In the embodiment shown, a cooling fluid, which is driven by a first coolant pump 23 through the first cooling circuit, circulates through the first heat exchanger 21, the second heat exchanger 22, and the heat pump 33. The cooling fluid may be water with an additive such as glycol, for example. In one embodiment, other cooling fluids that may provide a temperature below the freezing point, for example, may be used. The cooling fluid transports heat from the first heat exchanger 21 and thus from the hot head of the pulse tube cooler 13 to the second heat exchanger 22 and/or the heat pump 33.

During correct operation (e.g., with an adequate power supply to the cooling system), the heat pump 33 cools down the cooling fluid of the first cooling circuit 20 and outputs the heat to the second cooling circuit 30. A cooling fluid, which outputs the heat to the environment (e.g., by a discharge heat exchanger 32) likewise circulates in the second cooling circuit 30, driven by the second coolant pump 31. During normal operation, the cooling system in FIG. 1 is thus a closed cooling system that only requires power, and not a continuous supply of coolant, at least except for the omnipresent external air. In such cases, the heat pump 33 provides for a sufficiently low flow temperature of the first cooling circuit 20 particularly with high outside temperatures. With permanently sufficiently low outside temperatures, it would also be possible, for example, for the heat pump to be replaced by a third heat exchanger.

In the cooling system in FIG. 1, aside from the pulse tube cooler 13, the heat pump 33 primarily has a high energy consumption, and the second coolant pump 31 and the exhaust air heat exchanger 32 with a fan use significant electrical power. In order in the case of a power failure to provide as a long a cooling process as possible with a limited amount of energy from an emergency power supply, the cooling system in FIG. 1, in case of emergency (e.g., without an external power supply and without the heat pump 33) provides a low flow temperature of the first cooling circuit 20.

As an emergency cooling system, an inflow of a low temperature coolant is provided via an emergency coolant supply. For example, the fresh water from the drinking water network may be routed through the second heat exchanger 22, so that the coolant of the first cooling circuit is cooled down to a temperature of 15 degrees Celsius, for example. Ground water that has temperatures of approximately 10 degrees Celsius in temperate latitudes may also be provided as emergency coolant, for example.

The cooling-down only takes place if, for example, the heated emergency coolant in the second heat exchanger 22 is permanently replaced by circulating cold emergency coolant. In such cases, the valve 41 may be considered to be a changeover switch between the two states. The valve in the opened state provides for a cooling-down of the second heat exchanger 22 and thus makes a second heat sink from the second heat exchanger 22. Conversely, the heat pump 33 heats up without an external power supply so that the first heat sink, for example, is no longer present, and the main part of the heat from the pulse tube cooler 13 is discharged via the second heat exchanger 22 to the emergency coolant.

Figure 3:
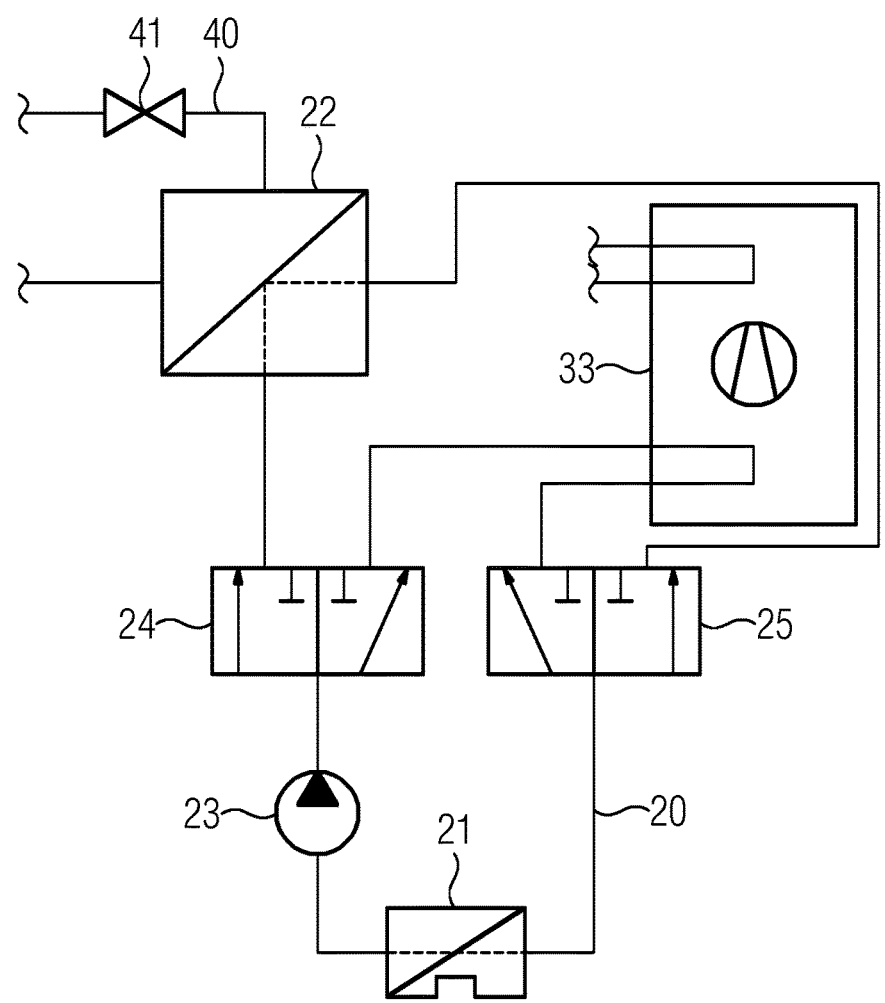
FIG. 3 shows a section of an embodiment of a cooling system.

In one variation of the cooling system, multi-way valves 24, 25 that optionally add the heat pump 33 and the second heat exchanger 22 to the first cooling circuit 20 or separate the heat pump 33 and the second heat exchanger 22 therefrom may be provided to supplement or replace the valve 41 in the first coolant circuit 20. If, depending on the operating state, only either the second heat exchanger 22 or the heat pump 33 is connected in the first cooling circuit in each case, the current resistance and thus the energy consumption of the cooling system thus reduces in an advantageous manner. Details are shown in FIG. 3.

In one embodiment, the second heat exchanger 22 may be an air heat exchanger with a fan, which routes ambient air through the second heat exchanger 22, so that the second heat sink is the room air. Depending on the ambient temperature and thermal capacity of the rooms or the building, an emergency cooling system may also be provided in this way.

A switchover between the states advantageously takes place by a controller of the cooling system or the magnetic resonance tomography system. The controller actuates, for example, the valve 40 and/or the multi-way valves 24, 25 by actuators or switches units on or off such as, for example, the second coolant pump 23 or the heat pump 33.

Figure 2:
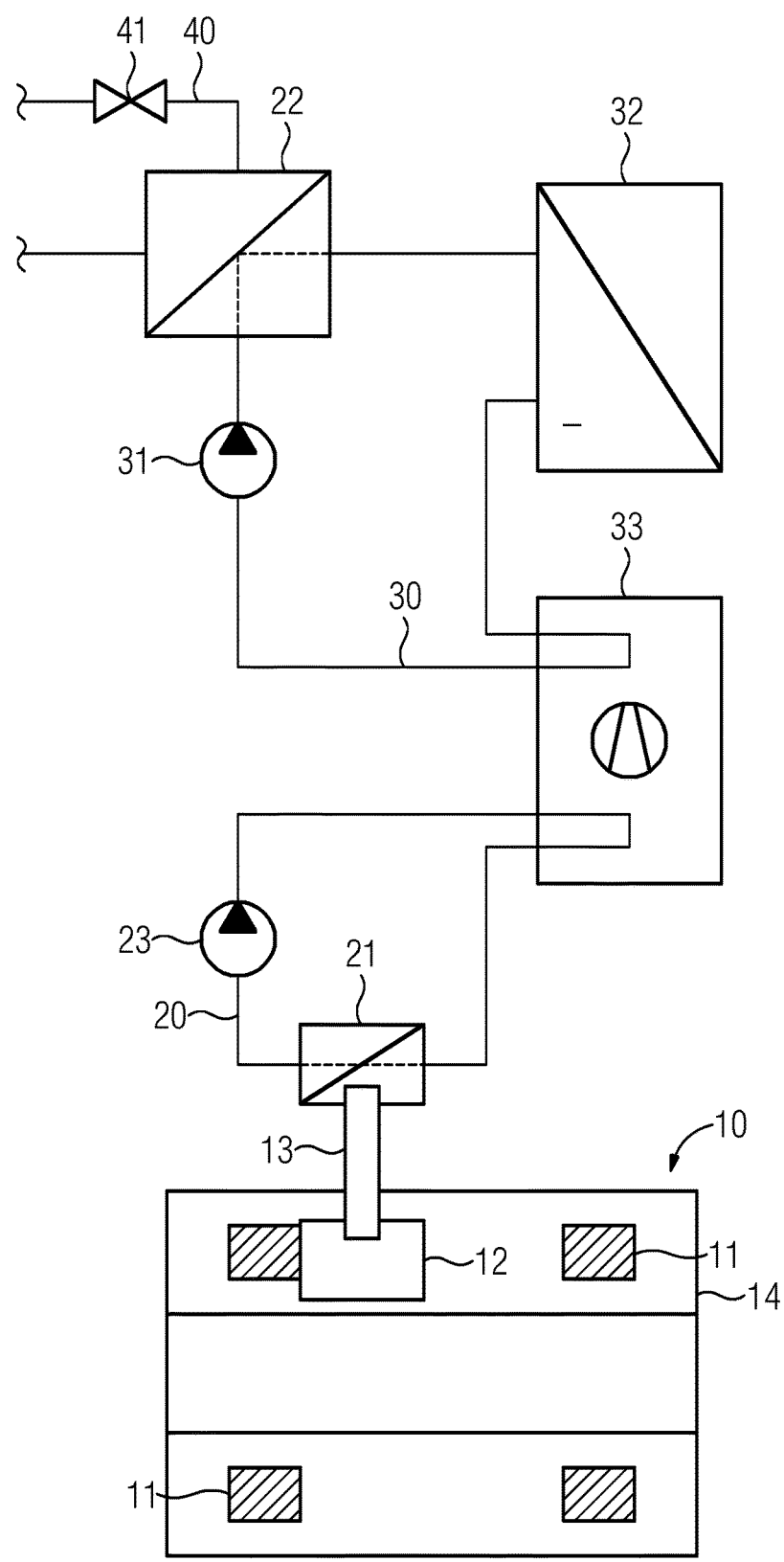
FIG. 2 shows an embodiment of a cooling system.

FIG. 2 shows a schematic representation of a further embodiment of a cooling system. The same objects are designated again with the same reference characters.

The embodiment in FIG. 2 differs substantially from the embodiment in FIG. 1 in that in the emergency mode (e.g., when an external power supply fails), it is not the first cooling circuit 20 that switches over but instead the second cooling circuit 30. The embodiment in FIG. 2 is particularly suitable, for example, if no emergency coolant with a sufficiently low flow temperature is available.

Contrary to FIG. 1, with the cooling system 2, the second heat exchanger 22 is added to the second cooling circuit 30. The coolant of the second cooling circuit 30 in such cases flows through the second heat exchanger 22 and is cooled down by this provided the valve 41 is opened, and the emergency coolant flows through the emergency coolant supply 40. The coolant then flows through the exhaust air heat exchanger 32, which, due to the fan that is switched off in order to save power in case of emergency, allows the coolant to flow through with a virtually unchanged temperature. The emergency coolant then absorbs the waste heat from the heat pump 33 and outputs this again in the second heat exchanger 22 to the emergency coolant. By the second heat exchanger 22 being cooled down by the emergency coolant with respect to the exhaust air heat exchanger 32 by opening the valve 40, the heat flow from the hot head of the pulse tube cooler is directed via the heat pump 33 away from the exhaust air heat exchanger toward the second heat exchanger 22.

As already mentioned in relation to FIG. 1 and subsequently in relation to FIG. 3, the second cooling circuit 30 may have one or a number of valves or multi-way valves 24, 25, so that the second heat exchanger 22 may be connected in the second cooling circuit and/or the exhaust air heat exchanger 32 may be switched into the second cooling circuit. Only either the second heat exchanger 22 or the exhaust air heat exchanger may be in the second cooling circuit. The additional flow resistance may therefore be avoided by two heat exchangers.

In one embodiment, the coolant in the second heat circuit 30 may firstly flow from the heat pump 33 through the exhaust air heat exchanger 32, be precooled hereby, and then be brought to the requisite flow temperature by the second heat exchanger 22 by the emergency coolant.

The embodiment in FIG. 2 is then particularly suitable if the emergency coolant does not have the requisite flow temperature for the first cooling circuit 20. In this case, due to a smaller temperature difference between the emergency coolant and the first cooling circuit 20, the power requirement of the heat pump 33 may be reduced since the emergency coolant is still colder than the inflow from the exhaust air heat exchanger 32.

FIG. 3 shows a first cooling circuit 20 in FIG. 1 in a variant with the described multi-way valves 24, 25. Via the first multi-way valve 24 and the second multi-way valve 25, the second heat exchanger 22 or the heat pump 33 may optionally be added to the first cooling circuit 20 so that the flow resistance of the cooling circuit is inter alia reduced. The switchover apparatus is realized by, for example, the collaboration of the first multi-way valve 24 and the second multi-way valve 25. As already mentioned, the multi-way valves 24, 25 may also be used in the embodiment in FIG. 2, so that in the same way, the second heat exchanger 22 may be added to the fluid flow of the second cooling circuit 30 or separated herefrom.

Although the invention has been illustrated and described in greater detail by exemplary embodiments, the invention is not limited by the examples disclosed. The person skilled in the art will be able to derive other variations without moving beyond the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A cooling system for a magnetic resonance tomography system, the cooling system comprising:
    a first coolant circuit including a first coolant pump;
    a first heat exchanger in thermal contact with an object to be cooled;
    a second heat exchanger; and
    a switchover apparatus configured to adjust a heat flow from the first coolant circuit to a first heat sink only, a second heat sink only, and both the first heat sink and the second heat sink,
    wherein the second heat sink, which is of the second heat exchanger, is fluidically connected to an emergency cooling system.

2. The cooling system of claim 1, wherein the switchover apparatus includes an actuator operable to change a flow rate of an emergency coolant from the emergency cooling system through the second heat exchanger.

3. The cooling system of claim 1, wherein the second heat exchanger is part of the first coolant circuit.

4. The cooling system of claim 1, wherein the first cooling circuit further includes a multi-way valve, and the second heat exchanger is includable in the first coolant circuit by the multi-way valve.

5. The cooling system of claim 1, further comprising a second cooling circuit, the second cooling circuit being thermally coupled to the first cooling circuit and including the first heat sink,
    wherein the second heat exchanger is part of the second coolant circuit.

6. The cooling system of claim 5, wherein the second cooling circuit further includes a multi-way valve, and the second heat exchanger is includable in the second coolant circuit by the multi-way valve.

7. The cooling system of claim 1, further comprising an uninterruptible power supply, the uninterruptible power supply being configured to only supply power to elements of the cooling system that are needed to maintain the heat flow from the first coolant circuit to the second heat sink.

8. The cooling system of claim 1, wherein the second heat exchanger is a 3-way heat exchanger that also exchanges heat with the first heat sink.

9. A magnetic resonance tomography system comprising:
    a cooling system comprising:
    a first coolant circuit including a first coolant pump;
    a first heat exchanger in thermal contact with an object to be cooled;
    a second heat exchanger; and
    a switchover apparatus configured to adjust a heat flow from the first coolant circuit to a first heat sink only, a second heat sink only, and both the first heat sink and the second heat sink,
    wherein the second heat sink, which is of the second heat exchanger, is fluidically connected to an emergency cooling system, and
    wherein the object to be cooled is a thermal head of a cryogenic cooler for a superconducting magnet.

10. The magnetic resonance tomography system of claim 9, wherein the switchover apparatus includes an actuator operable to change a flow rate of an emergency coolant from the emergency cooling system through the second heat exchanger.

11. The magnetic resonance tomography system of claim 9, wherein the second heat exchanger is part of the first coolant circuit.

12. The magnetic resonance tomography system of claim 9, wherein the first cooling circuit further includes a multi-way valve, and the second heat exchanger is includable in the first coolant circuit by the multi-way valve.

13. The magnetic resonance tomography system of claim 9, wherein the cooling system further includes a second cooling circuit, the second cooling circuit being thermally coupled to the first cooling circuit and including the first heat sink, and
wherein the second heat exchanger is part of the second coolant circuit.

14. The magnetic resonance tomography system of claim 13, wherein the second cooling circuit further includes a multi-way valve, and the second heat exchanger is includable in the second coolant circuit by the multi-way valve.

15. The magnetic resonance tomography system of claim 9, wherein the cooling system further comprises an uninterruptible power supply, the uninterruptible power supply being configured to only supply power to elements of the cooling system that are needed to maintain the heat flow from the first coolant circuit to the second heat sink.

16. The magnetic resonance tomography system of claim 9, wherein the second heat exchanger is a 3-way heat exchanger that also exchanges heat with the first heat sink.

17. A cooling system for a magnetic resonance tomography system, the cooling system comprising:
a first coolant circuit including a first coolant pump;
a first heat exchanger in thermal contact with an object to be cooled;
a second heat exchanger;
a switchover apparatus configured to adjust a heat flow from the first coolant circuit to a first heat sink, a second heat sink, or the first heat sink and the second heat sink, wherein the second heat sink, which is of the second heat exchanger, is fluidically connected to an emergency cooling system; and
a second cooling circuit, the second cooling circuit being thermally coupled to the first cooling circuit and including the first heat sink, wherein the second heat exchanger is part of the second coolant circuit.

* * * * *